United States Patent [19]

Le Can et al.

[11] 3,868,722

[45] Feb. 25, 1975

[54] SEMICONDUCTOR DEVICE HAVING AT LEAST TWO TRANSISTORS AND METHOD OF MANUFACTURING SAME

[75] Inventors: Claude Jan Principe Frederic Le Can; Walter Steinmaier, both of Nijmegen, Netherlands

[73] Assignee: U.S. Philips Corp., Briarcliff Manor, N.Y.

[22] Filed: Oct. 2, 1972

[21] Appl. No.: 294,465

Related U.S. Application Data

[62] Division of Ser. No. 154,438, June 18, 1971, abandoned.

[30] Foreign Application Priority Data

June 20, 1970 Netherlands ........................ 7009088

[52] U.S. Cl. ........................ 357/44, 357/46, 357/48, 357/34

[51] Int. Cl. ..... H01l 27/02, H01l 29/72, H01l 27/04

[58] Field of Search ........ 317/235 E, 235 R, 235 D, 317/235 WW

[56] References Cited

UNITED STATES PATENTS

| | | | |
|---|---|---|---|
| 3,309,537 | 3/1967 | Archer | 307/88.5 |
| 3,448,344 | 6/1969 | Schuster et al. | 317/101 |
| 3,473,977 | 10/1969 | Skouson et al. | 148/175 |
| 3,524,113 | 8/1970 | Agusta et al. | 317/235 |
| 3,581,165 | 5/1971 | Seelbach et al. | 317/235 |
| 3,596,115 | 7/1971 | Conzelmann | 307/303 |
| 3,607,465 | 9/1971 | Frouin | 148/175 |
| 3,631,311 | 12/1971 | Engbert | 317/235 |
| 3,655,457 | 4/1972 | Duffy et al. | 148/1.5 |

*Primary Examiner*—Stanley D. Miller, Jr.
*Assistant Examiner*—Joseph E. Clawson, Jr.
*Attorney, Agent, or Firm*—Frank R. Trifari; Jack Oisher

[57] ABSTRACT

A monolithic integrated semiconductor device according to the invention comprises a group of bipolar transistors of the same type (n-p-n or p-n-p) of which only a first sub-group is provided in insulated islands, said islands being surrounded by cup-shaped insulation zones, the transistors of a second sub-group having a common collector zone and the semiconductor body of the device comprising a low-ohmic substrate on which a high-ohmic epitaxial layer of the same conductivity type as that of the substrate is provided, said substrate belonging to the low-ohmic part of the common collector zone.

The first sub-group comprises at least one transistor. Preferably this first transistor is a self-insulating transistor which is provided in or at least adjoins the commen collector zone of the second subgroup, a cup-shaped insulation zone being used which forms part of the base zone of the first transistor and, with the collector zone of the second sub-group forms a p-n junction surrounding the first transistor.

11 Claims, 20 Drawing Figures

INVENTORS
CLAUDE J.P.F. LE CAN
WALTER STEINMAIER

BY

AGENT

INVENTORS
CLAUDE J.P.F. LE CAN
WALTER STEINMAIER

BY

[signature]

AGENT

INVENTORS
CLAUDE J.P.F. LE CAN
WALTER STEINMAIER
BY
AGENT

INVENTORS
CLAUDE J.P.F. LE CAN
WALTER STEINMAIER

BY

AGENT

INVENTORS
CLAUDE J.P.F. LE CAN
WALTER STEINMAIER

BY

AGENT

INVENTORS
CLAUDE J.P.F. LE CAN
WALTER STEINMAIER

BY

AGENT

INVENTORS
CLAUDE J.P.F. LE CAN
WALTER STEINMAIER
BY
AGENT

SEMICONDUCTOR DEVICE HAVING AT LEAST TWO TRANSISTORS AND METHOD OF MANUFACTURING SAME

This is a division of application Ser. No. 154,438, filed June 18, 1971, now abandoned.

The invention relates to a semiconductor device comprising a semiconductor body containing the semiconductor zones of at least a first and a second transistor being isolated from each other by means of an isolation zone, the semiconductor body having a substantially plane surface. Both the first and the second transistor comprise at least a group of three successive semiconductor zones of alternate conductivity types adjoining said surface, the second zone of both groups of three zones, viewed from the surface, extending to below the first zone and the third zone extending to below the second zone, corresponding zones of the two groups being of the same conductivity type. The invention furthermore relates to a method of manufacturing such a semiconductor device.

Such semiconductor devices having two or more transistors which are isolated from each other are known, for example, from "Philips Technical Review" vol. 27, nr. 7, 1966, pp. 192–199. The integrated circuits described in said paper comprise several isolated n-p-n transistors which are of the transverse or vertical type which means that, viewed from the semiconductor surface, the emitter, base and collector zones are situated one below the other. The n-type collectors of said transistors are formed by parts of an epitaxial layer which is provided on a p-type substrate. The mutual isolation of the transistors is obtained in that the n-type epitaxial layer is divided into a number of separate n-type parts or islands with a system of diffused p-type isolation zones which together constitute a grid and which extend from the semiconductor surface into the substrate region. In this construction two p-n junctions are crossed in the semiconductor body when proceeding from one to the other transistor, which junctions form a series-opposition circuit of two diodes, as a result of which the mutual electric isolation of the transistors is ensured at least for voltages lower than the breakdown voltage of the said diodes.

A considerable part of the available semiconductor surface area in these known integrated circuits is occupied by the deep and hence wide isolation zones as a result of which the area of the semiconductor surface which is available for the circuit elements themselves, namely the collective surface of the isolated islands, is restricted.

In "Electronics," vol. 41, nr. 22 of Oct. 28, 1968, p. 6E (International edition) a transistor for use in integrated circuits is described which requires considerably less space. In this self-isolating transistor, the collector zone which is cup-shaped and entirely surrounds the base zone serves at the same time for the isolation. The base zone is formed by a part of the epitaxial layer surrounded by the collector zone, which layer in this case is the same conductivity type as the substrate. A diffused emitter zone is provided in said epitaxial base zone. In this structure also the mutual electric isolation of the circuit elements is ensured because, proceeding from one transistor to the other, at least two p-n junctions are crossed.

The thickness of the base zone below the emitter in the last-described transistor structure depends inter alia upon the thickness of the grown epitaxial layer. Since the base thickness has considerable influence on the electric properties of the transistor, for example, the current amplification factor, the epitaxial layer must be provided carefully and with a thickness which is uniform throughout the semiconductor wafer.

Furthermore, it may occur in various circuits, in particular in logical circuits, that during operation the base-collector junction becomes biased at least temporarily in the forward direction. In the two transistor structures described this may give rise to undesirable transistor action because in both structures the p-n junction between the collector zone and the substrate is biased in the reverse direction due to the required insulation, as a result of which the substrate may serve as a collector for the charge carriers injected in the collector zone from the base zone. In this manner large leakage currents to the substrate may occur.

Moreover, in the two types of integrated circuits described, a considerable part of the available area of the semiconductor body is necessary for the mutual electric connection of the various circuit elements. Since the number of circuit elements per integrated circuit and hence the complexity of the circuit increase with the improved manufacturing methods described, the metallisation with which the electric connection is realized occupies an ever increasing part of the surface.

In order to simplify the required wiring pattern and to reduce the semiconductor surface area required per circuit element it has already been proposed to provide, for example, transistors, the collectors of which convey the same potential in the circuit in the same isolated part or island of the semiconductor body, so that said transistors actually have one common collector zone. In many cases and in particular in logical circuits which usually are constructed from a number of equal gate circuits, a comprise is necessary in which the transistors in question have to be distributed between a number of isolated islands which each constitute a common collector zone, in which in most of the cases each gate circuit comprises one such island because otherwise long conductive tracks for the connection to the remaining isolated elements are necessary. In connection with the fact that crossovers are to be avoided, the complexity of the metallisation pattern and the size of the area required for this purpose increase in the last-mentioned case.

The invention further relates to a monolithic integrated semiconductor device having a semiconductor body comprising a group of bipolar transistors, each transistor of which has an emitter zone, a base zone and a collector zone which adjoin a surface of the semiconductor body, in which, in the semiconductor body, the base zone surrounds the emitter zone and the collector zone surrounds the base zone, the emitter zone and the collector zone being of the one conductivity type and the base zone being of the opposite conductivity type, the group comprising a first and a second sub-group, the bipolar transistors of the first sub-group being isolated from those of the second sub-group and the second sub-group consisting of bipolar transistors having a common collector zone.

In such known semiconductor devices all the bipolar transistors of the group are present in isolated islands, i.e. parts of the one conductivity type of the semiconductor body which adjoin a surface of said body and are surrounded in the said body by semiconductor material of the opposite conductivity type.

The islands of these known devices are of the type conventionally used in integration technology and consist of parts of the one conductivity type of an epitaxial layer, which parts are separated from each other by isolation zones of the opposite conductivity type which extend throughout the thickness of the epitaxial layer, the epitaxial layer being provided on a semiconductor substrate of the opposite conductivity type.

One of the objects of the invention is to simplify the structure of a semiconductor device of the type mentioned in the preamble in which the group of bipolar transistors occupies less space, The output is improved during the manufacture, a wider choice regarding the location of the transistors of the second sub-group is possible, and the wiring pattern which in such devices is provided on an insulating layer present on the semiconductor body can be simplified.

For that purpose, such a monolithic integrated semiconductor device according to the invention is characterized in that the semiconductor body comprises a semiconductor substrate of the one conductivity type on a surface of which an epitaxial semiconductor layer, likewise of the one conductivity type, is provided, the substrate, from its surface situated opposite to the surface on which the epitaxial layer is provided to at least over the greater part of its thickness, having a lower resistivity than the epitaxial layer. Further the semiconductor body comprises at least one buried layer of the opposite conductivity type serving as an isolation zone and extending from the proximity of the interface between the substrate and the epitaxial layer in the substrate over a part of the thickness of the substrate, the epitaxial layer comprising isolation surface zones which extend up to the buried layer as a result of which the semiconductor body comprises at least one isolated part of the one conductivity type adjoining the surface of the epitaxial layer and surrounded in the semiconductor body by isolation zones. Each transistor of the first sub-group is present in such an isolated part, the substrate of the one conductivity type and a part of the one conductivity type of the epitaxial layer situated beside the isolated parts with their isolation zones and adjoining throughout its extent the substrate of the one conductivity type being associated with the common collector zone of the transistors of the second subgroup, the base and emitter zones of said last-mentioned transistors being present entirely in the said part of the epitaxial layer.

So in a semiconductor device according to the invention the bipolar transistors of the second sub-group are not provided in an island. This simlifies the structure of a semiconductor device and it is found that said simplified structure improves the yield during the manufacuture. Since no isolation zones are provided for the bipolar transistor of the second sub-group, a space saving is obtained. Moreover, the choice of the location of said transistors is not so much restricted, since said transistors are not provided in an island, which enables a simplified wiring of mutual electric connections of the transistors of the whole group. An electric connection conductor for the common collector zone of the transistors of the second sub-group can simply be connected to the low-ohmic substrate which means a further simplification of the said wiring. By using a comparatively low-ohmic substrate and a comparatively high-ohmic epitaxial layer, the transistors of the second sub-group have an $nn^+$ or a $pp^+$ collector zone which has a favourable effect on the properties of said transistors.

For applications in which mutual electric insulation between transistors of the first sub-group is desirable, the transistors of said sub-group may be distributed between a number of isolated parts of the one conductivity type of the semiconductor body.

The collector zone of a bipolar transistor of the first sub-group preferably has a buried layer of the one conductivity type which is more highly doped than another part of the collector zone and which extends below the base zone of the transistor. As a result of this the collector resistance of the transistor is reduced.

In order to reduce the collector resistance of the bipolar transistors of the second sub-group an embodiment according to the invention is characterized in that the common collector zone of the bipolar transistors of the second sub-group has a buried layer of the one conductivity type which is more highly doped than another part of the common collector zone associated with the epitaxial layer of the one conductivity type, said buried layer extending below the base zone of the transistors of the second group and being present, at least over part of its thickness, in the epitaxial layer and extending in the substrate at most over a part of the thickness of the substrate.

The invention is of particular importance for integrated semiconductor devices in which both subgroups of bipolar transistors are provided in a common uninterruped semiconductor body and in which all the transistors provided isolated islands (isolated parts of the semiconductor body) are bipolar transistors.

A further object of the invention is to provide a semiconductor device have transistors which are isolated from each other in which the risk of stray or parasitic transistor action is considerably reduced. Another object of the invention is to provide a transistor structure which is selfisolating and in which the said dependence of the thickness of the base zone on the thickness of an epitaxial layer is avoided at least for the greater part.

The invention is inter alia based on the recognition of the fact that this can be achieved by using the base zone of the transistor — instead of the collector zone — also as an isolating zone and that in that case a transistor structure can be obtained which can present a number of additional other advantages which will be described in detail below.

According to the invention the semiconductor device of the type mentioned in the preamble is characterized in that the second zone of the first transistor comprises, beside the part situtated intermediately between the first and the third zone of the said transistor, a cupshaped part which coheres with said intermediate part, as a result of which the last-mentioned second zone substantially entirely surrounds the third zone of the first transistor in the semiconductor body and forms the isolation zone which, together with the third zone of the second transistor, forms an isolating p-n junction which substantially surrounds the first transistor.

The first transistor may be a field effect transistor in which the first zone is, for example, annular and forms a first gate electrode, the third zone serving as a second gate electrode. The first zone may also be a zone which overlaps the intermediate part of the second zone locally as a result of which a connection between the first and the third zone is obtained and these two zones together constitute the gate electrode. In both cases the second zone comprises the source and drain electrode zones and the intermediately located channel region.

The second transistor preferably is a transverse bipolar transistor in which the first zone of said transistor in the semiconductor body is fully surrounded by the second zone. The second zone forms the base zone of the transistor. Of the first and the third zones the smaller is preferably used as the emitter and the larger as the collector. In that case the first zone is the emitter zone and the third zone is the collector zone of the bipolar transistor.

In an important embodiment of the semiconductor device according to the invention the first transistor in particular is a transverse bipolar transistor in which the first zone in the semiconductor body is surrounded by the intermediate part of the second zone. Of this structure also the first and the third zone preferably form the emitter zone and the collector zone, respectively, of the transistor.

In such a semiconductor device the collector zone of the first transistor nowhere adjoins the third zone of the second transistor which zone plays the role of substrate for the first transistor. Charge carriers which can be injected from the base zone in the collector zone, hence cannot flow away to the substrate as a leakage current. On the contrary, slightly more space is required as compared with the described known self-isolating transistor. However, an important space saving is realized as compared with the described non-self-isolating transistors, mainly in that no separate isolation zones are necessary which, as a result of the tolerances to be taken into account due to the alignment of the various diffusion masks, must actually be situated at ample distance from the base zone.

It was already noted that two p-n junctions which forms a series-opposition circuit are used in the described known integrated circuits for the mutual isolation of the circuit elements. In the semiconductor device according to the invention only one isolating p-n junction is present between the first and the second transistor, which junction is biased in the reverse direction during operation.

The substrate of the semiconductor body may be used as a connection, for example, as a supply connection of the device, as a result of which the metallisation pattern is simplified in many cases. The transistors having a common collector connection need not be combined in one or a few islands but are less restricted as regards their location since the substrate forms the common collector zone. Without this requiring more area, they may be situated so that integrated circuits having a simple topology can be realized with a metallisation pattern of comparatively short conductor tracks. The metallisation can usually be used as the starting point in designing the layout. Once the metallisation pattern has been designed, the circuit elements can be situated on the basis thereof. This in contrast with the so far commonly used method of designing in which first the location of the circuit elements is established and then a metallisation pattern adapted to said location is designed.

Furthermore, in particular for use in logical circuits, it is inter alia of advantage that the basecollector junction consists of two parts. The first part thereof is present between the intermediate part of the base zone and the collector zone. This part contributes in particular to the transistor action of the structure and in the operating condition collects the charge carriers injected by the emitter zone in the base zone. The second part extends between the cup-shaped insulating part of the base zone and the collector zone. This second part forms a diode which is connected parallel to the first part which is the actual base-collector junction of the transistor and which diode prevents the transistor from being driven far into saturation, so that the switching speed is increased. Owing to the comparatively large length of the p-n junction between the second and the third zone as a result of which the base-collector capacity can be comparatively large, said transistor remains less suitable, however, for applications in which particularly high requirements are imposed upon the switching speed.

Furthermore, the thickness of the base zone below the emitter zone is equal to the difference in depth of penetration of two surface zones and independent of the thickness of an epitaxial layer, if any.

The cup-shaped isolating part will frequently adjoint the third zone of the first transistor so that the second zone not only fully surrounds the third zone in the semiconductor body but also circumferentially adjoins the third zone and forms a p-n junction therewith.

The intermediate part preferably coheres with the cup-shaped isolating part at or at least in the proximity of the surface, the intermediate part extending in a direction parallel to the surface to near the isolating part and adjoining the isolating part at the area. In that case the intermediate part forms a projecting part or extension of the cup-shaped isolating part, said extension extending along the surface and above a part of the third zone.

The third zone of the second transistor may be, for example, an epitaxial layer which is provided on a substrate on the opposite conductivity type. In an important embodiment of the semiconductor device according to the invention, the third zone of the second transistor is a substrate of the one conductivity type on which an epitaxial layer of the same one conductivity type is provided, the cup-shaped isolating part of the second zone having a surface zone of the opposite conductivity type which at the surface of the semiconductor body surrounds a part of the epitaxial layer and extends in the semiconductor body up to a region of the opposite conductivity type which is present at the boundary of the epitaxial layer and the substrate. The said surface zone forms the wall of the cup-shaped isolating part of the second zone, which wall circumferentially adjoins and coheres with the bottom of the cup formed by the buried region. The part of the epitaxial layer situated within said cup forms the third zone of the first transistor.

The resistivity of the epitaxial layer may be adapted in normal manner to the requirements to be imposed upon the collector zones, while a low-ohmic substrate can advantageously be used the resistivity of which is lower than that of the epitaxial layer. The semiconductor body can be contacted in a simple manner on the substrate side, so as to be able to set up a suitable potential at it.

The said epitaxial layer may be a composite layer which is built up from two or more epitaxial layers of the one conductivity type having the same or different resistivity.

The present invention is of particular importance for integrated circuits which, in addition to the transistors already mentioned, comprise still other isolated circuit elements, such as diodes, further transistors, transistors of the complementary type, field effect transistors, capacitors and/or resistors. At least one further circuit element is preferably also surrounded by an isolating p-n junction between a cup-shaped isolation zone and the third zone of the second transistor.

The cup-shaped isolation zone of the further circuit element may serve only for the isolation or form part of the circuit element itself and may form, for example, the base zone of a second similar transistor, one of the zones of a diode or the collector zone of a complementary transistor.

In a further important embodiment of the semiconductor device according to the invention, the cup-shaped zones of the first transistor and one or more of the further circuit elements cohere together.

In this manner electric connections are obtained in a simple manner without metallisation, in which moreover a considerable space saving is obtained.

In addition, the cup-shaped isolating part of the second zone may be used for contacting the second zone which also saves space. A further embodiment of the semiconductor device according to the invention is therefore characterized in that an insulating layer is present on the surface on the semiconductor body, the second zone being provided with a conductive contact which is connected to the isolating part of the second zone in an aperture in the insulating layer.

The first zone of the first transistor in the semiconductor body is preferably fully surrounded by the second zone, in particular by the intermediate part of said zone.

In that case the contour of the first zone of the first transistor at the surface preferably follows the contour of the intermediate part of the second zone, at least in so far as it is situated outside the cup-shaped isolating part of the second zone, at substantially equal distance everywhere. Preferably, not only the intersections with the semiconductor surface of the p-n junction between the first zone and the intermediate part and of the p-n junction between the intermediate part and the third zone but also the said junctions themselves are substantially parallel to each other. As a result of this it is achieved that the thickness of the intermediate part below the first zone and at the edge of the intermediate part bounding the surface is substantially equal which may favour the electric properties of the transistor, while in addition the intermediate part of the second zone and the first zone can be provided through the same window so that less space is required and the operations for providing a photolacquer pattern and, if the doping of the intermediate part is effected in a non-oxidizing medium, also an etching treatment are eliminated during the manufacture.

The embodiments in which the first zone and the intermediate part of the second zone are provided through the same window is particularly effective when the intermediate part of the second zone, in so far as it is situated within the cup-shaped isolating part, is surrounded for the greater part at the surface by the third zone, for example, in the case of a rectangular zone, on three of the four sides.

In the circuits the base or in general the intermediate zone of a transistor is often connected to one or more resistors. In an important embodiment of the semiconductor device according to the invention such resistors are integrated in a simple manner with the relative transistor(s). This embodiment is characterized in that the second zone of the first transistor comprises at the surface at least a part projecting locally outside the cup-shaped isolating part, the projecting part adjoining the third zone of the second transistor, extending less far in the semiconductor body in a direction transverse to the surface than the cup-shaped isolating part, and comprising a conductive contact.

The integrated resistors are formed at least for the greater part by the projecting part of the second zone situated outside the cup-shaped isolating part, the intermediate part situated inside the cup-shaped isolating part forming the actual active part of the second zone, that is to say, the operating condition the transport of charge which is involved in the actual transistor action of the structure, takes place at least mainly.

It is to be noted that the self-isolating transistor described can also be used without a second transistor with a number of the advantages already mentioned in which case a number of the preferred embodiments described may be used also. In that case the semiconductor region which surrounds the isolating cup-shaped part of the base zone, forms part, for example, of a substrate region which serves as a common basic layer of the integrated circuit.

The invention also relates to a method of manufacturing the new semiconductor device described. This method is characterized in that activators of the opposite conductivity type are provided locally in a first surface region at a surface of a semiconductor substrate of the one conductivity type and that an epitaxial layer of the one conductivity type is formed on the said surface and a surface zone of the opposite conductivity type is provided from the upper surface of the epitaxial layer remote from the substrate, said surface zone surrounding at the upper surface a part of the epitaxial layer which is present above the first surface region, the cup-shaped second part of the base zone being formed during thermal treatments used in the manufacture, by diffusion of activators of the opposite conductivity type from the upper surface and from the first surface region in the expitaxial layer.

The activators may be provided, for example, by diffusion or by ion implantation. In the latter case the activators can be provided in the first surface region after the epitaxial layer has first been grown. When ion implantation is used, the epitaxial layer can even be avoided entirely and the starting material may be a homogeneously doped crystal. However, an epitaxial layer is preferably used. The substrate may be chosen to be low-ohmic which simplifies the electric connection of the substrate. In an important embodiment of the method according to the invention a substrate the layer of which adjoining the surface has, at least at the area of the first surface region, a higher resistivity than the remaining part of the substrate is used for the same reason.

The advantage of this is that the concentration of the activators of the opposite conductivity type in the first surface region need be chosen to be less high to obtain a zone of the opposite conductivity type at that area. For the remaining part of the substrate, the desirable low resistivity can then be used independently.

Preferably, the activators to form the surface zone of the opposite conductivity type are first provided from the upper surface of the expitaxial layer while the intermediate part of the second zone is then formed in a surface region which overlaps the inner edge of the said surface zone at least partly.

The activator concentrations for the surface zone and the intermediate part of the second zone which is associated with the active region of the transistor can then be chosen independently of each other. The concentration in the surface zone will usually be larger than in the active part of the second zone because the first-mentioned zone often has a larger depth of penetration.

A method may advantageously be used in which after the intermediate part of the second zone has been provided via an aperture in a masking layer provided on the upper surface of the epitaxial layer, activators to form the first zone in the semiconductor body are provided via an aperture in the masking layer the boundary of which coincides substantially with that of the first-mentioned aperture.

In the case of diffusion in a non-oxidizing atmosphere, the two apertures may be identical. If during the diffusion of the intermediate part of the second zone oxidation does occur, the first window can simply be opened by etching without using an etching mask also when the original masking layer consists of oxide. As a result of this the manufacture is simplified while in addition an attractive structure is obtained in which the thickness of the intermediate part below the first zone and along the edge situated at the upper surface is substantially equally large.

The upright wall of the cup-shaped isolating part of the second zone can be obtained entirely by diffusion from the upper surface of the epitaxial layer. Another possibility is that activators having a small diffusion coefficient, for example, arsenic, are provided in the central part of the first surface region and activators having a large diffusion coefficient, for example, phosphorus, are provided circumferentially at the edge of said surface region. In that case the upright wall can be formed entirely or partly by diffusion from the first surface region.

In order that the invention may be readily carried into effect, a few embodiments thereof will now be described in greater detail, by way of example, with reference to the accompanying diagrammatic drawings, in which FIG. 1 is a cross-sectional view of a part of a first embodiment of a semiconductor device according to the invention, in which FIGS. 2 and 3 each show a stage during the manufacture, and FIGS. 4, 5 and 6 each show a variation of the semiconductor device shown in FIG. 1;

FIG. 7 is a diagrammatic plan view of a part of a further embodiment of the semiconductor device according to the invention, while FIG. 8 is a diagrammatic cross-sectional view taken on the line VIII—VIII of FIG. 7;

FIG. 13 is a diagrammatic cross-sectional view of a part of a further example of the semiconductor device according to the invention, while FIG. 14 is a circuit diagram corresponding to a part of the embodiment shown in FIG. 13;

FIG. 15 is a circuit diagram of a gate circuit of which

Figure 1:
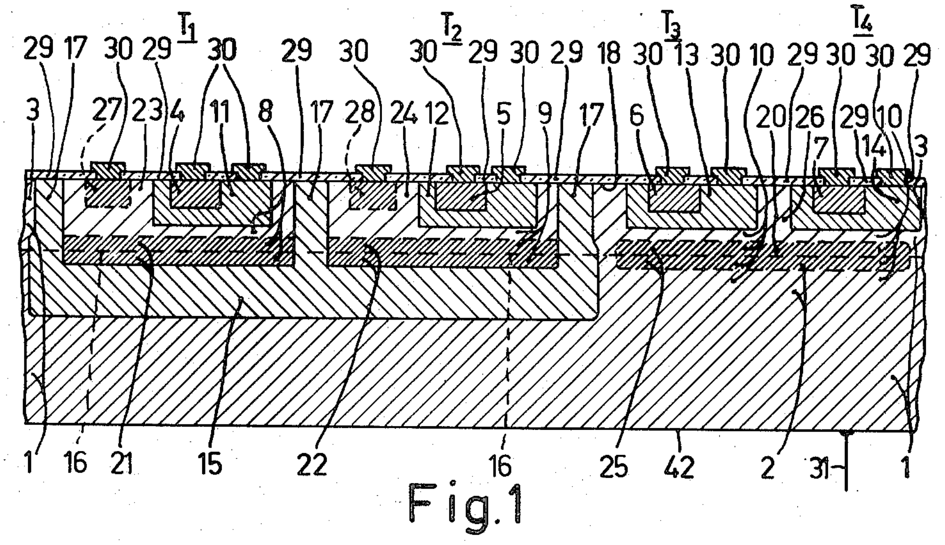

Corresponding components in the figures 1 to 6 are referred to by the same reference numerals.

The monolithic integrated semiconductor device of which FIG. 1 shows a part has a semiconductor body 1 comprising a group of bipolar transistors to which the transistors $T_1$, $T_2$, $T_3$ and $T_4$ belong. The emitter zones 4, 5, 6 and 7, the base zones 11, 12, 13 and 14 and the collector zones 8, 9 and 10 of said transistors adjoin the surface 18 of the semiconductor body 1, a base zone surrounding an emitter zone and a collector zone surrounding a base zone in the semiconductor body. The emitter zones 4, 5, 6 and 7 and the collector zones 8, 9 and 10 are of the one conductivity type, in the present example n-conductivity type, and the base zones 11, 12, 13 and 14 are of the opposite conductivity type, so in the present example, of the p-conductivity type. The group of transistors comprises a first sub-group to which the transistors $T_1$ and $T_2$ belong and a second sub-group to which the transistors $T_3$ and $T_4$ belong.

For reasons of simplicity it will be assumed hereinafter that the first sub-group comprises only the transistors $T_1$ and $T_2$, and the second sub-group comprises only the transistors $T_3$ and $T_4$. It will be obvious, however, that one or both sub-groups may comprise a larger number of transistors or only one transistor.

The bipolar transistors $T_1$ and $T_2$ of the first sub-group are isolated from the transistors $T_3$ and $T_4$ of the second sub-group and the transistors $T_3$ and $T_4$ of the second sub-group have a common collector zone 10.

According to the invention the semiconductor body 1 comprises an n-type semiconductor substrate 2, on a surface 16 of which an epitaxial layer 3 of the same conductivity type but having a larger resistivity is provided. So in the present embodiment the n-type substrate 2, from the surface 42 situated opposite to the surface 16 on which the epitaxial layer 3 is provided, has a lower resistivity throughout the thickness than the epitaxial layer 3. So the layer 3 is an n-type layer. The semiconductor body comprises a p-type buried layer 15 which serves as an isolation zone and extends from the proximity of the interface 16 between the substrate 2 and the epitaxial layer 3 in the substrate 2 over a part of the thickness of said substrate. The epitaxial layer 3 comprises isolation surface zones 17 which extend up to the buried layer 15. These zones 17 may entirely or partially consist of insulating material or may be constituted by p-type surfaces zones as in the present example. As a result the semiconductor body 1 comprises the isolated n-type parts 8 and 9 adjoining the epitaxial layer 3 at the surface 18, which parts are surrounded by p-type isolation zones 15 and 17 in the semiconductor body 1. The transistors $T_1$ and $T_2$ of the first sub-group are present in the isolated parts 8 and 9, said parts constituting the collector zones 8 and 9 of the transistors $T_1$ and $T_2$. The n-type substrate 2 and an n-type part 20 of the epitaxial layer 3 situated beside the isolated parts 8 and 9 with their isolation zones 15 and 17 and adjoining the n-type substrate 2 throughout its extent belong to the common n-type collector zone 10 of the transistors $T_3$ and $T_4$ of the second sub-group. The base and emitter zones 13, 14 and 6, 7 are present entirely in the n-type part 20 of the epitaxial layer 3.

The bipolar transistors $T_1$ and $T_2$ of the first sub-group are distributed between two n-type isolated parts 8 and 9 of the semiconductor body 1 and are hence also mutually isolated.

In the present embodiment the collector zones 8 and 9 of the transistors $T_1$ and $T_2$ of the first sub-group comprise n-type buried layers 21 and 22, respectively, which are more highly doped than other parts 23 and 24, respectively, of the collector zones 8 and 9. The parts 23 and 24 of the collector zones 8 and 9 adjoin the surface 18 of the epitaxial layer 3. As a result of this the collector resistance of said transistors is reduced. The buried layers 21 and 22 extend below the base zones 11 and 12.

The common collector zone 10 of the transistors $T_3$ and $T_4$ of the second sub-group also comprises an n-type buried layer 25 which is more highly doped than another n-type part 26 of the common collector zone 10 associated with the epitaxial layer 3. This part 26 adjoins the surface 18 of the epitaxial layer 3. The buried layer 25 extends below the base zone 13 and 14 of the transistors $T_1$ and $T_2$ and is present in the epitaxial layer 3 over part of its thickness. The buried layer 25 furthermore extends over part of the thickness of the substrate 2 in the substrate 2.

The collector resistance of the transistors $T_3$ and $T_4$ is reduced by the buried layer 25, while their properties better correspond to those of the transistors $T_1$ and $T_2$, which may be desirable. If this should not be of much significance for the application for which the semiconductor device is destined, the n-type buried layer 25 may be omitted and, for example, only the n-type buried layers 21 and 22 may be provided.

The semiconductor device shown in FIG. 1 can be manufactured entirely by means of process steps conventionally used in semiconductor technology while the zones and layers of the transistors as well as the isolation zones have normal dimensions. Therefore, the manufacture of the semiconductor device shown in FIG. 1 will be described only in general.

Figure 2:
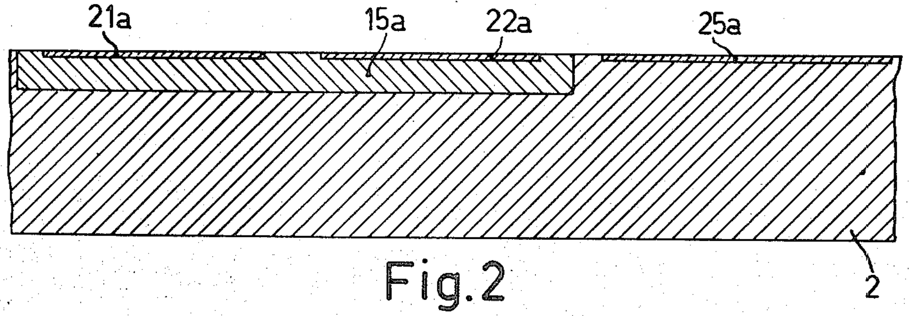

Starting material is an n-type silicon substrate 2, having a resistivity of approximately 0.01 ohm cm (see FIG. 2). A p-type surface zone **15*a* is provided in the substrate 2, for example, by diffusion of boron. The surface concentration of the zone 15*a* is, for example, $10^{19}$ boron atoms per cm. In and beside the surface zone 15*a*, the n-type surface zones 21*a*, 22*a* and 25*a* are provided, for example, by diffusion of arsenic with, for example, a surface concentration of $10^{20}$ arsenic atoms per ccm. The zones 21*a*, 22*a* and 25*a* are considerably thinner than the zone 15*a***.

Figure 3:
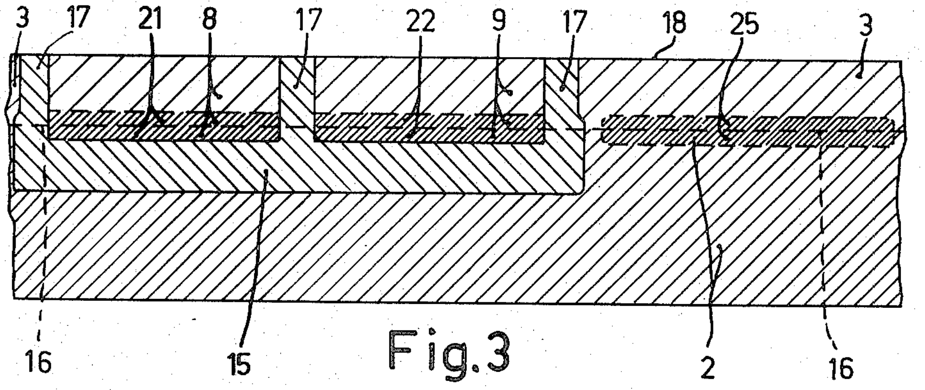

An n-type epitaxial silicon layer 3, thickness, for example, 6 microns, resistivity 0.6 ohm.cm, is provided, see FIG. 3. By diffusion of, for example, boron in the surface 18 of the epitaxial layer 3, the p-type isolation surface zones 17 are obtained. During the provision of the layer 3 and the zones 17 diffusion of the impurities with which the zones **15*a*, 21*a*, 22*a* and 25*a* are provided occurs, as a result of which said zones assume the shape of the zones 15, 21, 22 and 25 in FIG. 3. The zones 17 extend up to the zone 15 and isolate the n-type parts 8 and 9 of the part of the semiconductor body 1 present outside the zones 17 and 15. The junction between the epitaxial layer and the substrate is diagrammatically denoted by the interface 16.**

The p-type base zones 11, 12, 13 and 14, see FIG. 1, are then provided, for example, by diffusion of boron and the n-type emitter zones 4, 5, 6 and 7 are provided, for example, by diffusion of phosphorus. The n-type collector contact zones 27 and 28 of the transistors $T_1$ and $T_2$ which are more highly doped than the parts 23 and 24 of the collector zone 8 and 9 can also be provided by diffusion of phosphorus and preferably simultaneously with the provision of the emitter zones 4, 5, 6 and 7. The surface concentration of the base zones is, for example, $10^{18}$ boron atoms per ccm and the surface concentration of the emitter zones and the collector contact zones is $10^{20}$ phosphorus atoms per ccm.

The epitaxial layer 3 is provided with an insulating layer 29 in normal manner. In the present embodiment the layer 29 is of silicon oxide and is obtained by an oxidation treatment of the epitaxial layer 3. The insulating layer 29 can serve in normal manner as a diffusion mask during the provision of the zones 4, 5, 6, 7, 11, 12, 13, 14, 17, 27 and 28 and may for that purpose be provided prior to the provision of the said zones. The insulating layer 29 may also consist, for example, of silicon nitride and be provided after the diffusion treatments.

Conductors 30 are connected to zones of the transistors $T_1$, $T_2$, $T_3$ and $T_4$ via apertures in the insulating layer 29. These conductors extend to over the insulating layer 3 and form on the insulating layer at least a part of a wiring pattern which forms the electric connections between a number of part of the semiconductor device. The conductors 30 consist, for example, of aluminum.

The semiconductor device has a simple structure, since only the transistors $T_1$ and $T_2$ are provided in isolated islands and can be mass-produced with a large yield. Furthermore, the transistors $T_3$ and $T_4$ which are not provided in an isolated island occupy less space than when they would be provided in an isolated island indeed, while in addition the choice of the location of said transistor is not so restricted which is favourable to obtain on the insulating layer 29 a wiring which is as simple as possible with short connections.

An electric connection to the common collector zone 10 of the transistors $T_3$ and $T_4$ is connected to the low-ohmic n-type substrate 2 and is denoted by 31 in FIG. 1. This connection 31 may be, for example, a conductive plate on which the substrate 2 is secured by soldering or alloying. If it is desirable for the collector zone 10 to be provided with a connection conductor on the upper side of the semiconductor device, the part 26 of the common collector zone 10 may be provided with an n-type collector contact zone of the type as the collector contact zones 27 and 28, to which the connection conductor is connected via an aperture in the insulating layer 29.

By using a substrate 2 which has a lower resistivity than the epitaxial layer 3, a common $nn^+$ collector zone of the transistors $T_3$ and $T_4$ is obtained with a low collector resistance also when the buried layer 25 is not present. For many applications a reference potential can be applied to the n-type substrate. The substrate may be connected, for example, to earth.

Figure 4:
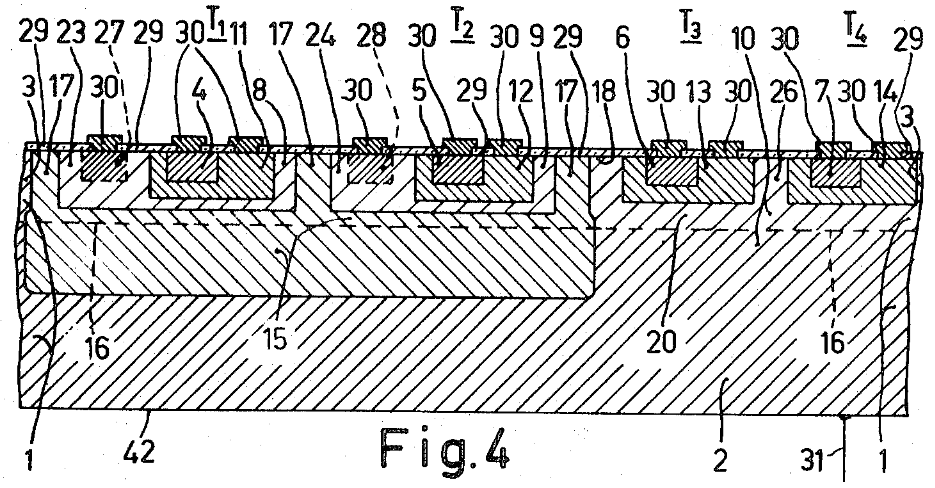

When for an application of the semiconductor device as shown in FIG. 1, a slightly larger collector series resistance is permissible, the buried collector layers 21, 22 and 25 may be omitted. In that case a structure is obtained as is shown in FIG. 4. It may be desirable in this case to choose the epitaxial layer 3 to be slightly thicker and/or to choose the impurity concentration in the substrate 2 at least near the interface 16 and in the buried layer 15 to be slightly lower.

Figure 5:
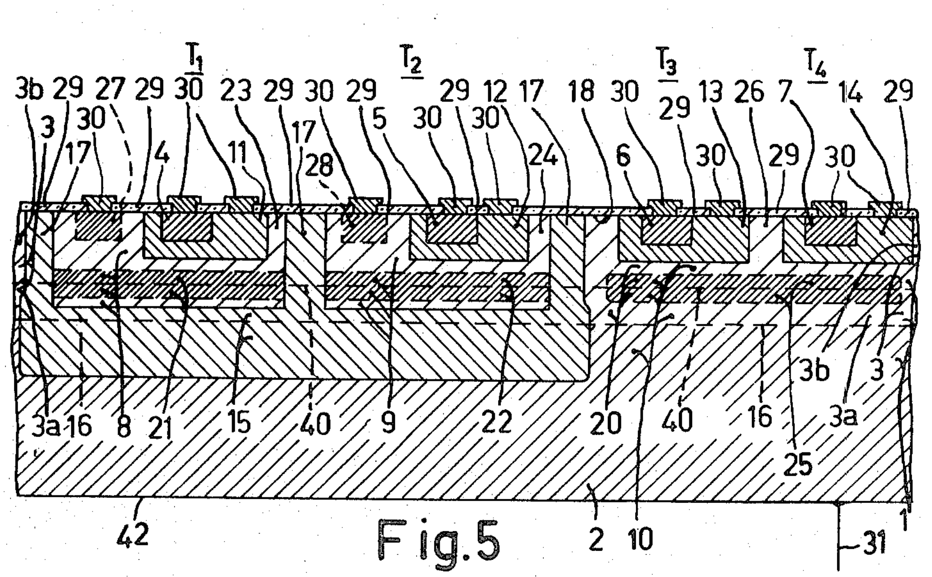

FIG. 5 shows an example which is slightly varied relative to the embodiment shown in FIG. 1 and in which the epitaxial n-type layer 3 consists of two epitaxial n-type sub-layers *3a* and *3b* having approximately the same resistivity, while the buried n-type collector layers 21, 22 and 25 extend on either side of the interface 40 between said sub-layers *3a* and *3b*.

During the manufacture, only the p-type surface zone *15a* is provided in the substrate and the n-type surface layers *22a* and *25a* are not provided (see also FIG. 2). These n-type surface layers are provided in the epitaxial sub-layer *3a* after providing said sub-layer and the epitaxial sub-layer *3b* is then provided. For the rest, the manufacture of the device shown in FIG. 5 is similar to that of the device shown in FIG. 1.

Since the buried layers 21 and 22 are provided separated from the buried layer 15 in the embodiment shown in FIG. 5, the choice of the impurities and the concentration thereof for said layers is not so much restricted. For the rest, the layers 21 and 22 may adjoin the layer 15.

In this embodiment also it is possible to provide only the n-type buried layers 21 and 22 and to omit the n-type buried layer 25. Furthermore, a further buried n-type collector layer may be provided for the transistors $T_3$ and $T_4$, which layer also extends below the base zones 13 and 14 and which is obtained from an n-type surface zone which is provided in the substrate 2 prior to providing the epitaxial sub-layer *3a*. The said further buried layer may then form one thick buried layer together with the buried layer 25 in order to reduce the collector resistance of the transistors $T_3$ and $T_4$. It is alternatively possible that only said further buried layer is provided for said transistors $T_3$ and $T_4$.

In the embodiments described, the starting material may be an n-type substrate 2 which, in addition to an impurity causing n-type conductivity, also comprises an impurity which causes p-type conductivity and which diffuses more slowly than the impurity causing the n-type conductivity. The p-type buried layer 15 may then be obtained by local out-diffusion, the more rapidly diffusing n-type impurity diffusing out more rapidly than the more slowly diffusing p-type impurity so that the p-type impurity starts dominating in a surface zone.

Figure 6:
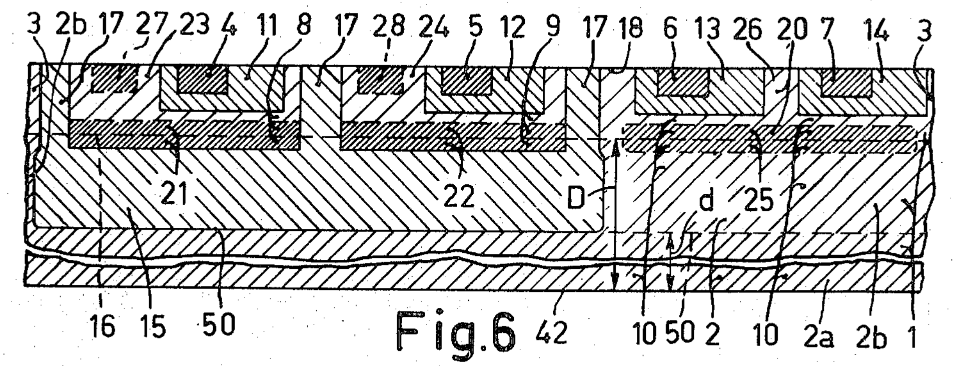

FIG. 6 shows an embodiment which differs from that shown in FIG. 1 only in that the substrate 2, from its surface 42 situated opposite to the surface 16 on which the epitaxial layer 3 is provided, has a lower resistivity than the epitaxial layer 3 only to over a part *d* of its thickness D. So the substrate 2 comprises a layer *2b* which has a larger resistivity than the underlying part *2a*. The junction betwen the layer *2b* and the part *2a* is diagrammatically denoted by the interface 50. The buried p-type layer 15 is provided for the greater part in the layer *2b* of larger resistivity, while the n-type buried layers 21, 22 and 25 extend over a part of their thickness in the layer *2b*.

In the manufacture of this embodiment the starting material is an n-type substrate 2 which comprises an n-type surface layer *2b* which has a larger resistivity than the underlying n-type part *2a* of the substrate 2. The p-type and n-type surface zones of the type as shown in FIG. 2 are provided in the layer *2b*, after which the manufacture is similar to that of the semiconductor device shown in FIG. 1.

The layer *2b* of the substrate 2 may be obtained by out-diffusion or by epitaxial deposition of semiconductor material on the part *2a*.

The layer *2b* which has a larger resistivity enables a wider choice for the impurity concentrations of the buried layers. The layer *2b* need not have a larger resistivity than the epitaxial layer 3. The resistivity of the layer *2b* may also be equal to or slightly larger than that of the epitaxial layer 3.

If desirable, the buried layer 25 may be omitted or be combined with a second buried n-type layer which extends from the face 50 at least in the direction of the buried layer 25 and is more highly doped than the part 26 of the epitaxial layer 3. In addition it is possible to omit all the n-type buried layers. The p-type buried layer 15 in practice usually extends at least up to the part *2a*.

Finally it is to be noted that the isolation zones 17, 25 may be provided with a connection conductor to apply to said zone potential at which a p-n junction which bounds said zone is biased in the reverse direction and the desirable isolation is thus obtained. According to a further aspect of the invention, however, the isolation zones are preferably floating, that is to say that said zones have no connection to give them a potential which differs from that which said zones would assume without said connection. This is of importance in particular when the low-ohmic substrate 2 is the most positive supply line of the integrated semiconductor device. In practice this usually means that the isolation surface zones 17 are entirely covered by the insulating layer 29. Floating isolation zones 17, 25 provide the advantage that the composite capacity formed by the two capacities in series of the pn-junctions bounding the isolation zones 17, 25 is small and is substantially constant at least in an important region of potential differences over the isolation zones. The said composite capacity is substantially constant since in the case of a variation in the potential difference over the isolation zones, the capacity of one of the p-n junctions bounding said zones becomes larger, that of the other, however, becomes smaller, or conversely. This is caused by one of the said p-n junctions being in the forward direction and the other being in the reverse direction.

In general it may be said that in an integrated semiconductor device which comprises cup-shaped isolation zones of the opposite conductivity type, which isolate a surface part of the one conductivity type from another part of the one conductivity type of the semiconductor body, such cup-shaped zones can often advantageously be floating.

Figures 7, 8:
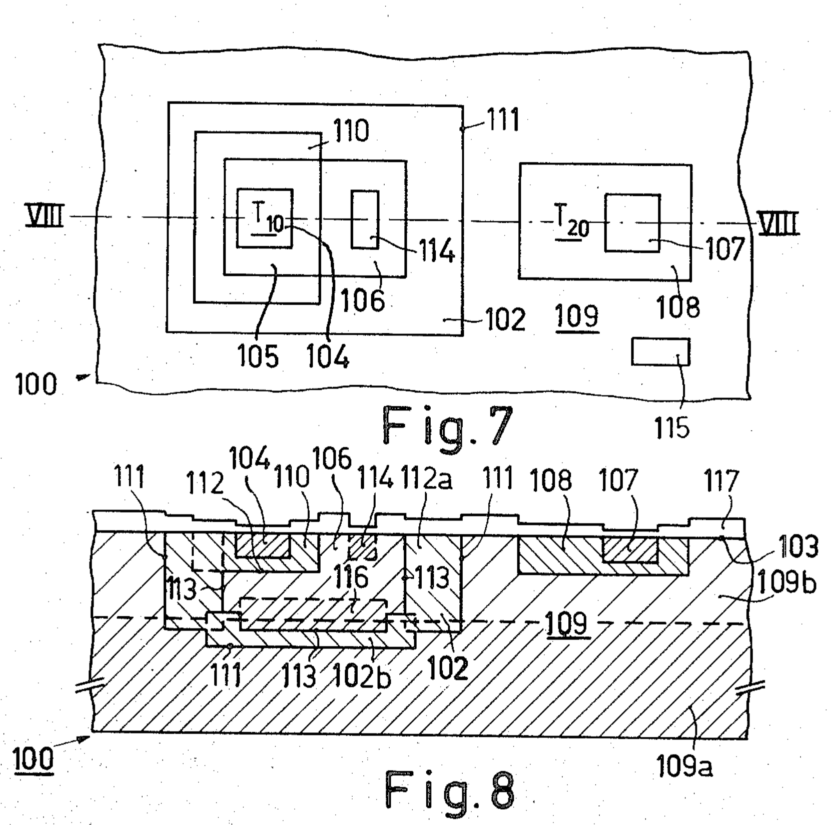

Another example is the integrated circuit of which a part is shown in FIGS. 7 and 8. This semiconductor device comprises a semiconductor body in which the semiconductor zones of at least a first transistor $T_{10}$ and a second transistor $T_{20}$ extend and which are isolated from each other by means of an isolation zone. The semiconductor body 100 has a substantially flat surface 103 and the transistors $T_{10}$ and $T_{20}$ each comprise at least a group of three successive semiconductor zones of alternate conductivity types adjoining the surface 203, namely the zones 104, 105 and 106 and the zones 107, 108 and 109, respectively. Viewed from the surface 103, the second zones 105 and 108, respectively of the two groups of three zones extend to below the first zones 104 and 107, respectively, and the third zones 106 and 109, respectively, extend to below the second zones 105 and 108, respectively. Furthermore, corresponding zones of two groups, so the zones 104 and 107, and the zones 105 and 108, and the zones 106 and 109, respectively, are of the same conductivity type.

According to the invention the second zone 105 of the transistor $T_{10}$ comprises, beside the part 110 situated between the first zone 104 and the third zone 106, a cup-shaped part cohering therewith as a result of which the second zone 110, 102 fully surrounds the third zone 106 in the semiconductor body and forms the isolation zone which, with the third zone 109 of the transistor $T_{20}$, forms an isolating p-n junction 111 surrounding the transistor $T_{10}$.

The transistor $T_{10}$ is a self-isolating transistor having a semiconductor body at a surface of which a region of the one conductivity type adjoins, said region comprising three successive zones of alternate conductivity types adjoining the surface, the activator concentration in the central one of the said three zones being furthermore larger than in a part of the underlying outermost zone, hereinafter termed the third zone, adjoining the central zone, the central zone being of the opposite conductivity type and, with the exception of the part situated between the two outermost zones, having a second cup-shaped part cohering therewith, the third zone in the semiconductor body being surrounded by the central zone and the central zone with the said region of the one conductivity type constituting an isolating p-n junction surrounding the transistor. The isolation of the transistor has been obtained by means of the central zone, in the present example the base zone 110, 102. This in contrast with the known self-isolating transistor. In this known transistor the collector zone also serves as an isolation zone. One of the advantages of the self-isolating transistor according to the invention is that it can be provided in the collector region of a transistor of the same type. In other words, the substrate may be used as a common collector (or as a common emitter) of a number of transistors of a given type, while in addition isolated transistors of the same type in which corresponding zones have the same conductivity type can simply be used.

The second transistor $T_{20}$ is a transverse bipolar transistor in which the first zone 107 in the semiconductor body is fully surrounded by the second zone 108. Of the zones 107 and 109, the zone 107, which is the smaller, usually serves as an emitter zone while in that case the zones 108 and 109 constitute the base and collector zones, respectively.

In the present example, the first transistor $T_{10}$ is also a bipolar transistor. The zones 104; 110, 102; 106 constitute the emitter zone or the collector zone, the base zone and the collector zone, or the emitter zone, respectively. However, the transistor $T_{10}$ may also be a field effect transistor. The zone 104 may be, for example, annular, at least be constructed with a closed geometry and form a gate electrode. The source and drain electrodes may be formed by the part of the zone 110, 102 situated outside and inside such an annular zone, while the zone 106 may serve as a second gate electrode. Another possibility is, for example, that in which the zone 110 is divided into two parts which cohere via a channel region in that the zone 104 overlaps the zone 110 in the lateral direction and coheres with the zones 106.

The collector zone 106 of the bipolar transistor $T_{10}$ is fully surrounded by the base zone 110, 102 and thus nowhere adjoins a substrate, which as in the known structures may serve as a collector of a parasitic transistor. This is of importance in particular for logic circuits in which as is known the base-collector junction can become biased in the forward direction in circumstances and charge carriers can be injected from the base zone into the collector zone. In the presence of a parasitic transistor to the substrate, large leakage current may be the result. It will be obvious that this problem is entirely avoided in a transistor as the transistor $T_{10}$ described.

Furthermore it is of importance that considerably less space is required for the transistor $T_{10}$ than is required for a transistor provided in the usual manner in an isolated island. This space saving is a result of the fact that the active part 110 of the base zone engages the isolation zone 111. In the normal structure on the contrary, the base zone and the isolation zones must be situated at a distance from each other, and said distance must moreover be comparatively large owing to the tolerances to be observed in connection with the alignment of the various diffusion masks relative to each other and the deviations which may occur during said alignment.

In contrast with the known semiconductor devices having circuit elements isolated from each other by p-n junctions, the semiconductor device according to the invention comprises no series-opposition circuit of two diodes but only one single insulating diode 111. In the operating condition, the p-n junction 111 must be biased in the reverse direction which, in practice, is nearly always the case automatically and certainly when the collector zone 109 is used as a supply connection.

By using the collector zone 109 as a supply connection, a simpler metallisation pattern can be used in many cases because said connection is available at any desirable place on the semiconductor surface 103 via the substrate and can be connected to the various circuit elements via short conductive tracks.

Because in addition the transistors with common collector, for example, transistor $T_{20}$, are not restricted any longer to an isolated island as in the conventional structure and hence require less space and are not restricted as regards the location, and in addition the isolated transistors occupy less space, the starting point in designing the layout or topology of more complex integrated circuits may be a draft metallisation pattern in which the location of the circuit elements is determined by said metallisation pattern. In the commonly used methods the location of the circuit elements is rather determined first, with a view to an optimum use of the available semiconductor surface, while a metallisation pattern which is adapted to the location of the circuit elements is then established.

Figure 9:
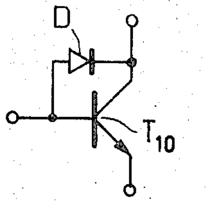
FIG. 9 is a simple electric equivalent circuit diagram of the self-isolating transistor according to the invention.

The base-collector junction of the transistor $T_{10}$ consists of two parts 112 and 113. The first part 112 is present between the intermediate part 110 of the base zone 110, 102 and the collector zone 106. This part contributes in particular to the transistor action and in the operating condition collects the charge carriers injected by the emitter zone 104 into the base zone. The second part 113 is present between the cup-shaped isolating part 110 and the collector zone 106 and forms a diode D which is shown in FIG. 9 and which is connected parallel to the actual active base-collector junction 112. The diode D prevents the transistor $T_{10}$ from being too far bottomed which has a favorable influence on the switching speed of the transistor $T_{10}$.

The thickness of the base zone of the active part of the self-isolating transistor $T_{10}$, so below the emitter zone 104, is determined by the difference in depth of penetration from the surface 103 of the zones 110 and 104.

The third zone of the second transistor, in the present example the collector zone 109 of transistor $T_{20}$, is a substrate 109*a* of the one conductivity type on which an epitaxial layer 109*b* of the same one conductivity type is provided. The cup-shaped zone 102 of transistor $T_{10}$, shows a surface zone 102*a* of the opposite conductivity type which surrounds a part 106 of the expitaxial layer 109*b* at the semiconductor surface 103 and extends from the surface 103 up to a region 102*b* of the opposite conductivity type which is present at the boundary of the epitaxial layer 109*b* and the substrate 109*a*. The surface zone 102*a* forms the upright wall of the cup-shaped isolating part 102 and circumferentially adjoins the bottom of the cup formed by the buried region 102*b*. The part 106 of the epitaxial layer situated inside said cup is the collector zone of the transistor $T_{10}$.

The resistivity of the epitaxial layer 109*b* can be adapted in normal manner to the requirements to be imposed upon the collector zones and the collector-base junctions. The substrate 109*a* is preferably low-ohmic in connection with the above-described contacting on the lower side in which a low series resistance is desirable. Furthermore, if desirable, the collector zone 106 may be provided with a contact zone 114. In so far as the voltage applied to the substrate 109*a* must be applied to one of the remaining circuit elements via a conductive track, said conductive track can be connected to the substrate, via an aperture in the insulating layer and a contact zone 115, at a place which is suitably chosen with a view to a simple metallisation pattern. These zones 114 and 115 can be provided, for example, simultaneously with the emitter zones 104 and 107. In order to reduce the collector series resistance, the collector zone of the transistor $T_{10}$ has a buried part 116.

In otherwise normal manner, the various semiconductor zones can be connected, via apertures in an insulating layer 117 present on the semiconductor surface 103, to conductive tracks for contacting and/or connecting other circuit elements of the device. These conductive tracks as well as the said apertures are not shown in the FIGS. 7 and 8 to avoid complexity of the drawing.

Figure 10:
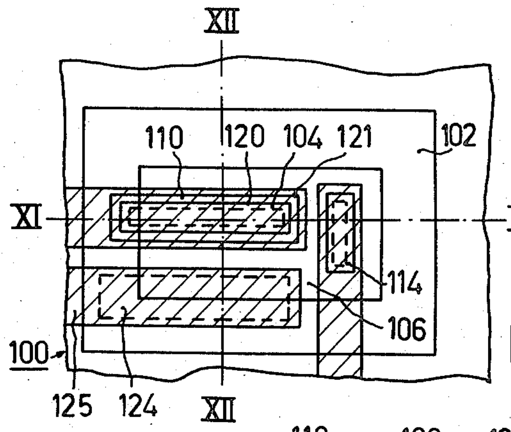
FIG. 10 is a diagrammatic plan view of another embodiment of the self-isolating transistor as is used in the device shown in FIGS. 7 and 8, FIGS. 11 and 12 are diagrammatic cross-sectional views taken on the lines XI—XI and XII—XII, respectively, of FIG. 10.
Figures 11, 12:
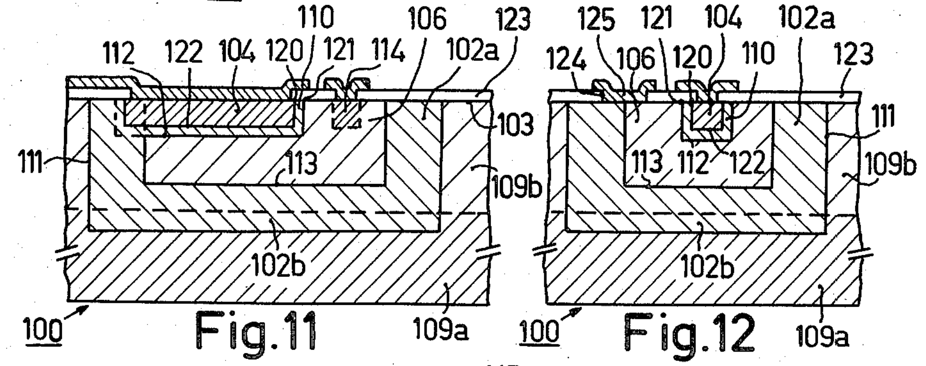

Of course, other geometries may be used for the transistors. For example, FIGS. 10 to 12 show another embodiment of the transistor $T_{10}$ in which corresponding components are referred to by the same reference numerals as in FIGS. 7 and 8. In this embodiment the contour 120 of the emitter zone at the surface 103 follows the contour 121 of the intermediate part 110 of the base zone 110, 102 everywhere at substantially equal distance. The contours 120 and 121 are the intersections with the semiconductor surface 103 of the p-n junction 122 between the emitter zone 104 and the intermediate part 110, and of the p-n junction 112 between the intermediate part 110 and the collector zone 106, respectively. For the rest, not only the contours 120 and 121 but also the p-n junctions 112 and 122 themselves are substantially parallel to each other substantially throughout their surface. The thickness of the intermediate part 110 at the edges and below the emitter zone 104 hence is substantially equal which has a favourable influence on the electric properties of the transistor.

In this embodiment the cup-shaped isolating part 102 of the base zone 110, 102 is used for contacting the base zone. An insulating layer 123 in which an aperture 124 is provided is present on the semiconductor surface 103. A conductive track 125 extends over the insulating layer 123 and through the aperture 124 up to the semiconductor surface 103. In the aperture 124, the conductive track 125 forms a conductive junction with the cup-shaped insulating part 102. In addition, the aperture 124 is provided in this case so that the conductive track 125 also forms a Schottky junction with the collector zone 106. As is known such a Schottky diode between the base and the collector increases the switching speed of the transistor in which it is to be noted that a Schottky diode in this respect is even more effective than the above-mentioned p-n diode 113, owing to its smaller threshold voltage.

One of the advantages of the fact that the base contact can be provided on the cup-shaped part 102 is that the active part of the base zone, so the intermediate part 110, and the emitter zone 104 can be provided via the same aperture in a masking layer, in which the same aperture can furthermore be used for the emitter contact. In addition to the above-mentioned improvement of the electric properties of the transistor, which is the result of this, the manufacture is also simplified by it. For example, the operations for providing a pattern of photolacquer and, if the doping is effected in a non-oxidizing medium, an etching treatment is also saved.

In so far as the intermediate part 110 is situated inside the insulating part 102, it is surrounded for the greater part at the surface 103 by the collector zone 106 as a result of which optimum use is made of the fact that in this case the edge of the transistor is also active as a result of the uniform base thickness. It is to be noted that in so far as the emitter zone 104 and the cup-shaped part 102 overlap each other slightly, said part of the emitter zone usually is substantially not active because the cup-shaped part 103 usually is more strongly doped than the intermediate part 110. The injection of charge carriers from the emitter zone will mainly take place in the part of the base zone having the smallest doping concentration.

For completeness' sake it is to be noted that upon diffusion of impurities through an aperture in a masking layer the depth of penetration, as is known, in a direction transverse to the semiconductor surface is larger than in a direction parallel to the surface. This means that, also if the base zone and the emitter zone are provided through the same aperture, the base thickness is not exactly uniform. The distance between the p-n junctions will usually be slightly smaller in the proximity of the surface, so at the edge beside the emitter zone, than below the emitter zone.

Figures 13, 14:
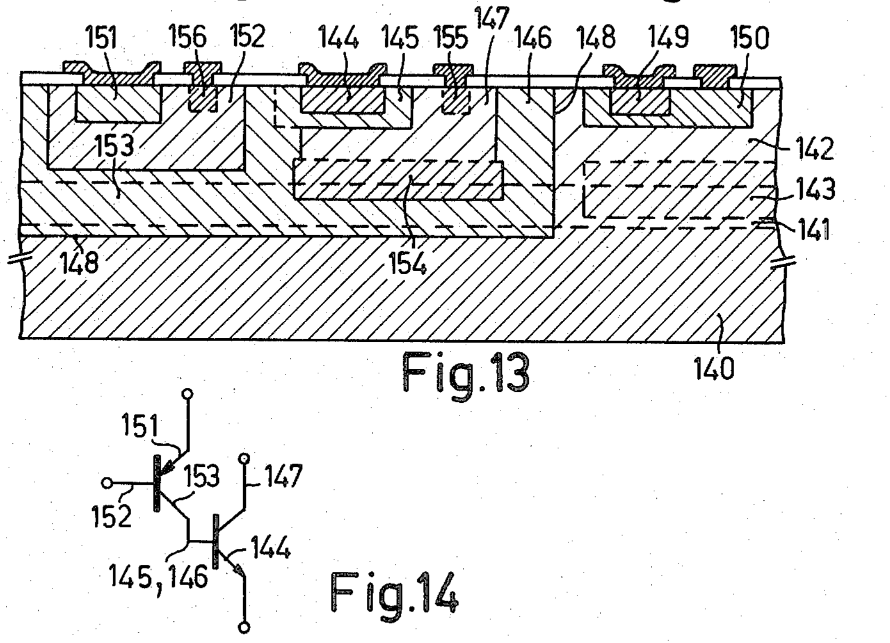

A further example which will be described with reference to FIG. 13, comprises a substrate 140 which is provided with a composite epitaxial layer which is constructed from two parts 141 and 142. In the semiconductor body are present the emitter zone 144, the base zone 145, 146 and the collector zone 147 of a self-isolating first transistor which is separated, by an isolating p-n junction 148, from a second transistor of the same type having an emitter zone 149, a base zone 150 and a collector zone 140 to 143. In addition to these two transistors a further isolated circuit element is present, namely a complementary transistor having an emitter zone 151, a base zone 152 and a collector zone 153. The collector zone 153 is cup-shaped and forms an isolating p-n junction 148 with the collector zone 140 to 143. The cup-shaped zones 146 and 153 of the first transistor and of the complementary transistor cohere together as a result of which an electric connection as shown in FIG. 14 is obtained without metallisation.

The collector zones 147 and 140 to 143 are both provided with a buried part 154 and 143, respectively, to reduce the collector series resistance. In addition, contact zones 155 and 156, respectively, are present in the collector zone 147 and in the base zone 152. The use of a composite epitaxial layer 141, 142 is related to the method of manufacturing as will be described in detail below.

The invention is of particular importance for logic circuits. As an example of such a circuit, a gate circuit will be described with reference to FIGS. 15 to 19. This gate circuit is the subject matter of copending Pat. application Ser. No. 155,036, file June 21, 1971. The operation of this circuit is of no significance for the present invention which is the reason why it will not be described here. Such a gate circuit may serve, for example, as a component for constructing larger logical circuits, for example, flip-flops, comparators or memories.

Figure 15:
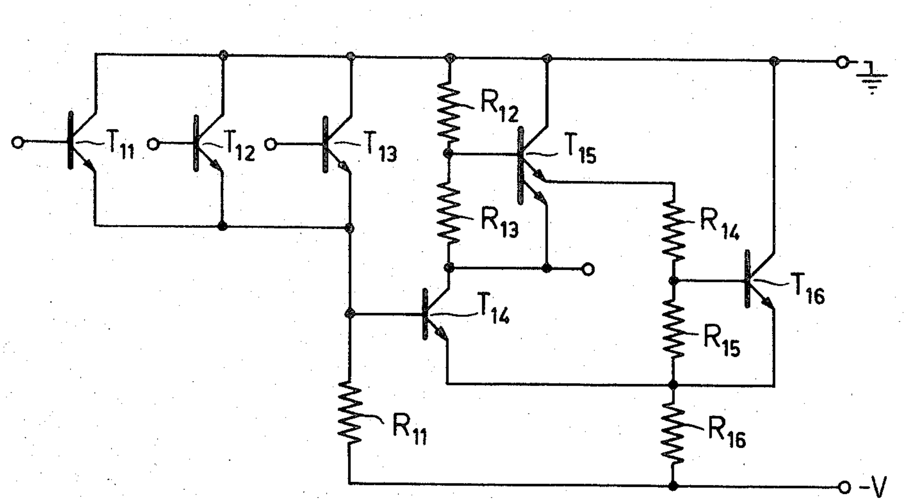
Figure 17:
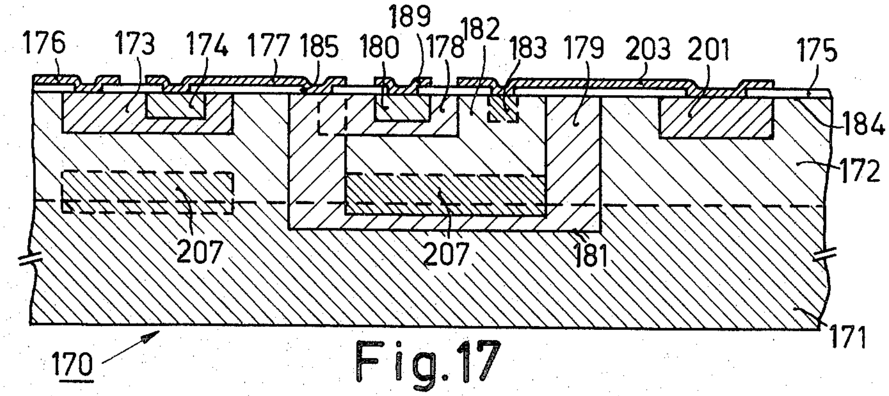
FIGS. 17, 18 and 19 are diagrammatic cross-sectional views taken on the lines XVII—XVII, XVIII—XVIII, XIX—XIX respectively, of FIG. 16.
Figure 19:
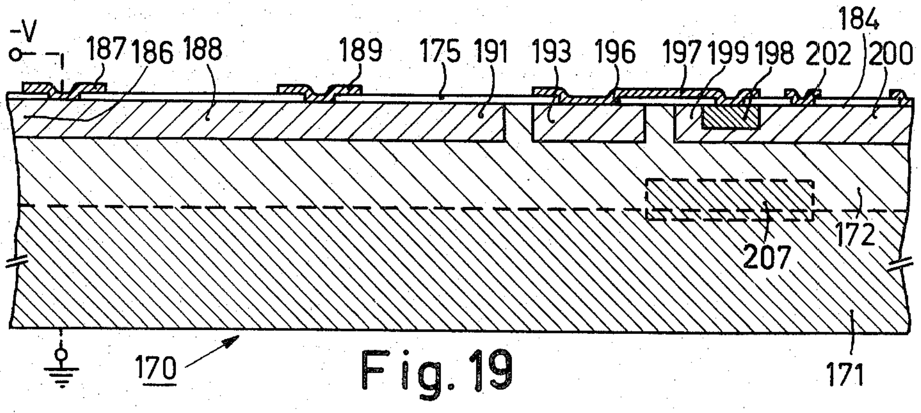
Figure 16:
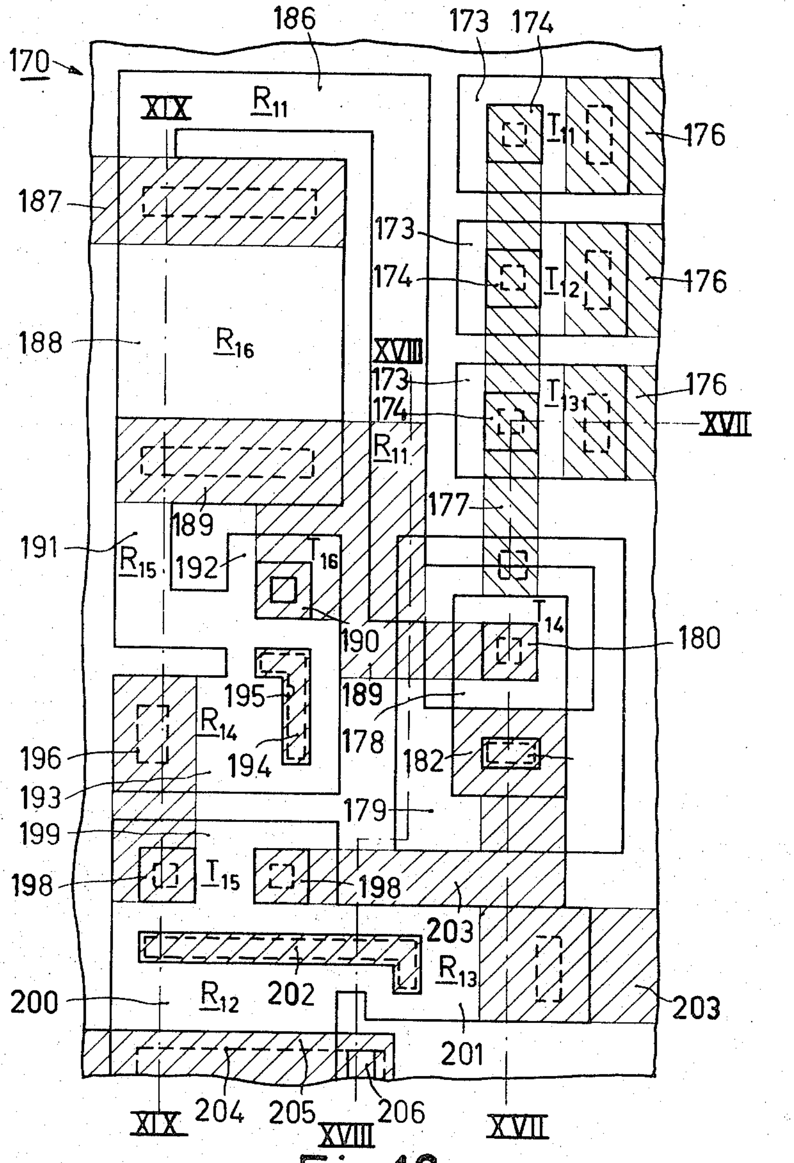
FIG. 16 is a diagrammatic plan view of an embodiment as an integrated circuit according to the invention.
Figure 18:
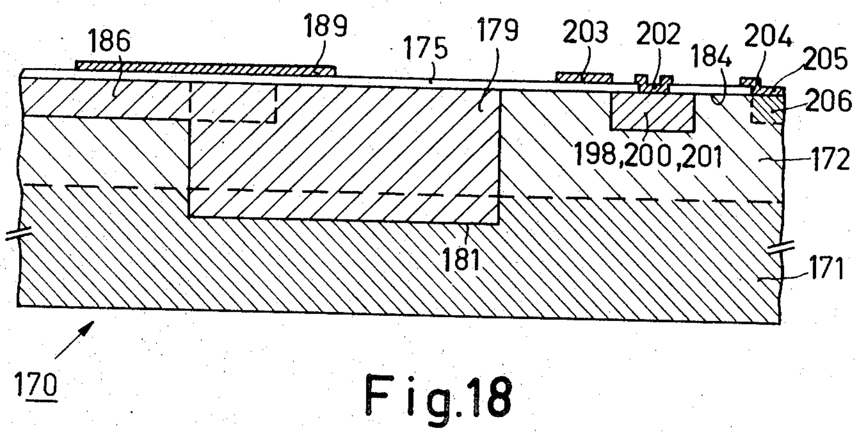

FIG. 15 shows the electric circuit diagram, while FIG. 11 shows a topology or lay-out of said circuit in which the various circuit elements in said figures are denoted by corresponding reference numerals.

The semiconductor device comprises a semiconductor body 170 which has a low-ohmic substrate 171 on which an epitaxial layer 172 of the same conductivity type and having a higher resistivity is provided. The substrate 171 and the epitaxial layer 172 together constitute the common collector zone of the transistors $T_{11}$ to $T_{13}$, $T_{15}$ and $T_{16}$, which can be set up at a reference potential, for example, earth. In the present embodiment the positive terminal of the supply source is also connected hereto so that the substrate conveys the most positive potential which occurs in the circuit.

The input transistors $T_{11}$ to $T_{13}$ each have a base zone 173 and an emitter zone 174. Via metal tracks 176 which are present on the insulating layer 175 and are connected to the base zones 173 in apertures in the insulating layer, input signals can be applied to the transistors $T_{11}$, $T_{12}$ and $T_{13}$.

A metal track 177 connects the three emitter zones 174 to the base zone 178, 179 of the isolated transistor $T_{14}$. This base zone has an intermediate part 178 which in the semiconductor body surrounds an emitter zone 180 and a cup-shaped isolating part 179 which, with the common collector zone 171, 172, forms an isolating p-n junction 181 which surrounds the transistor $T_{14}$. The collector zone 182 of the transistor $T_{14}$ which is provided with a contact zone 183 is fully surrounded by the base zone 178, 179 in the semiconductor body. The intermediate part 178 of the base zone coheres on the semiconductor surface 184 with the isolating part 179, the intermediate part 178 extending, in a direction parallel to the surface 184, to in the proximity of the isolating part 179 and adjoining the part 179 at that area. As a result of this the intermediate part 178 forms a continuation or extension of the isolating part 179 adjoining the semiconductor surface 184, which extension is present above the collector zone 182.

The isolating part 179 at the semiconductor surface 184 is annular, at least shows a closed geometry. This ring may be used for contacting the base zone 178, 179. Above the isolating part 179 the insulating layer 175 can be provided, at a suitably chosen place, with an aperture 185 through which the conductive track 177 is connected to the base zone 178, 179. Due to this flexibility as regards the place of the base-metal contact, the metallisation pattern can often be constructed simpler and with shorter conductive tracks, in which crossing metal tracks can often be avoided more easily.

As appears from the circuit diagram (FIG. 15), the resistor $R_{11}$ is connected to the base of the transistor $T_{14}$. This has been done to save a conductive track and the space for the associated contact apertures in the insulating layer. The second zone 178, 179 of the transistor $T_{14}$ at the surface 184 has a part 186 projecting locally beyond the isolating part 179, said part 186 adjoining the common collector zone 171, 172 and in a direction transverse to the semiconductor surface 189, extending less far in the semiconductor body than the cup-shaped isolating part 179. This projecting part 186 can be provided, for example, simultaneously with the intermediate part 178. The intermediate part 178 situated inside the cup-shaped part 179 forms the actual active part of the base zone of the transistor $T_{14}$, that is to say the part in which in the operating condition the charge transport which is involved in the actual transistor action of the structure takes place at least mainly. The resistor $R_{11}$ is formed at least for the greater part by the part 186 projecting outside the cup-shaped part 179. So besides for the isolation of the transistor, the isolating part 179 also serves for the low-ohmic connection of the active part of the base zone and as a low-ohmic connection between the active part and the resistor $R_{11}$.

Figure 20:
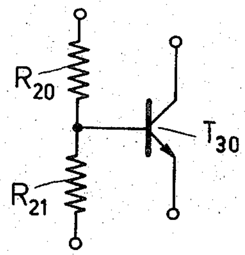
FIG. 20 is a circuit diagram including a self-isolating transistor according to the invention.

It will be obvious that in the same manner several resistors can also be connected to the base zone so that, for example, the frequently occurring circuit shown in FIG. 20 can also be integrated simply, the cup-shaped isolating part serving as a low-ohmic connection between the two resistors $R_{22}$ and $R_{21}$ and the active base zone of the transistor $T_{30}$.

The resistor $R_{11}$ is further connected to the negative terminal of the supply voltage. For that purpose the zone 186 is connected to a metal layer 187 via an aperture in the insulating layer 175.

The resistor $R_{16}$ is formed by the zone 188 and is connected, via an aperture in the insulating layer, to a metal track 189 which leads to the emitter zone 180 of the transistor $T_{14}$ and to the emitter zone 190 of the transistor $T_{16}$. The resistor $R_{15}$ is formed by the zone 191 which coheres on the one side with the zone 188 and coheres on the other side with the base zone 192 of the transistor $T_{16}$. The resistor $R_{14}$ is formed by a zone 193 cohering with the base zone 192. By using a metal layer 194 which is present on the semiconductor surface in the aperture 195 in the insulating layer which is situated beside the emitter zone 190 and opposite to the aperture 196, the resistance value of the resistor $R_{14}$ is better determined. Via the aperture 196 and the metal track 197 the resistor $R_{14}$ is connected to a first of the two emitters 198 of the multi-emitter transistor $T_{15}$. In the semiconductor body the two emitter zones 198 are surrounded by a base zone 199. The zones 200 and 201 which constitute the resistor $R_{12}$ and $R_{13}$, respectively, cohere with the said base zone 199. In these resistors also a metal layer 202 on the semiconductor surface is used for a better definition of the resistance values. A metal track 203 which connects the second emitter 198 of the transistor $T_{15}$ to the collector zone 182 of the transistor $T_{14}$ and to the resistor $R_{13}$ forms the electric output of the gate circuit. Through an aperture 204 in the insulating layer, the resistor $R_{12}$ is connected to a metal layer 205 which, by means of a contact zone 206, is connected to the common collector zone 171, 172.

Furthermore, the transistor $T_{11}$ to $T_{16}$ each comprise a buried low-ohmic part 207 to reduce the collector series resistance, which low-ohmic parts 207 extend on and in the proximity of the interface between the substrate 171 and the epitaxial layer 172.

The use of the invention provides important advantages in particular in an integrated circuit as described above having a group of transistors with a common zone. The first advantage to be mentioned is that fewer isolated regions are necessary than in a conventional construction as a result of which a higher efficiency may be reckoned with. Furthermore, the space saving is considerable, in particular in the case of a large number of transistors having a common zone, also because in that case the topology and the metallisation can be kept simpler as a result of the fact that the location of the said transistors is not restricted and the transistors need not be accommodated, as is usual, in a common isolated island.

The gate circuit described has a simple metallisation pattern. A considerable number of connections has been realized without metal tracks, while the circuit elements can furthermore be grouped so that also due to the comparatively large freedom, as regards the places of contacting the insulating zones, short conductive tracks will do for the remaining internal connections.

The semiconductor devices described can be manufactured by means of the conventional methods of locally doping semiconductor material. The manufacture of the semiconductor device shown in FIG. 13 will not be described by way of example.

Starting material is, for example, an n-type silicon body or substrate having a resistivity of approximately 0.01 ohm.cm. In a first surface region of this substrate 140 which corresponds to the place of the buried part of the insulation zone 146, acceptors, for example, boron are provided. The silicon body is provided, for example, with a masking oxide layer in which an aperture is provided by means of the commonly used photoresist methods. The body is then transferred to a boron-containing atmosphere at approximately 950° C for approximately 30 minutes, succeeded by heating for approximately 4 hours of 1200°C in an oxidizing atmosphere. In otherwise normal manner an n-type epitaxial layer 141, for example, approximately 6 to 10 $\mu$m thick, approximately 0.3 to 1 ohm.cm. resistivity is then grown. In a surface region of this epitaxial layer which corresponds to the places of the buried parts 143 and 154, donors, for example, arsenic or antimony, are provided, for example, by heating at approximately 1200°C in an arsenic-containing atmosphere for 2 hours, after which the body is maintained in an oxidizing atmosphere at approximately 1200°C for approximately 4 hours. During this and the subsequent treatments, acceptors also diffuse from the buried boron-doped parts into the epitaxial layer 141.

The epitaxial layer 142 is grown in the following stage. This layer is also of n-type material and has a thickness of approximately 6 $\mu$m and also a resistivity of approximately 0.3 to 1 ohm.cm. In a surface region which has a closed configuration and corresponds to the place of the upright walls of the isolating cup-shaped part 146 and which hence surrounds one or more parts of the epitaxial layer 141, 142 which are situated above the first boron-doped surface region, acceptors are then provided from the upper surface of the epitaxial layer 141, 142 remote from the substrate 140, for example, by diffusion of boron at approximately 1100°C for approximately 30 minutes, succeeded by heating in an oxidizing atmosphere at approximately 1200°C for approximately 3 hours.

The intermediate part 145 and the parts 150 and 151 can be obtained by diffusion of boron at approximately 950°C for approximately 30 minutes, succeeded by heating at approximately 1180°C in an oxidizing atmosphere for approximately 30 minutes. The resistance per square of said zones is, for example, approximately 150 ohm. The diffusion of the intermediate part 145 occurs in a surface region which covers at least partly the inner edge of the surface zone of the isolating cup-shaped part obtained in the preceding operation.

The emitter zones 144 and 149 and the contact zones 155 and 156 are then provided by diffusion of phosphorus, for example, at approximately 1000°C for approximately 20 minutes and an after-heating of approximately 20 minutes at approximately 1050°C. the resistance per square of this zone is, for example, approximately 5 ohm.

Already mentioned was the diffusion of acceptors from the buried boron-doped part in the epitaxial layer. During the thermal treatments described, said diffusion continues until in combination with the diffusion in the reverse direction from the said surface zone, the closed cup-shaped p-type zone 146 is formed at the upper surface of the epitaxial layer. It is to be noted that the diffusion from the buried part occurs slowly at the area of the buried zone 154 as a result of the high donor concentration present there which impedes overdoping and which in addition causes an electric field which counteracts the diffusion of acceptors. As a result of this, the expansion of the buried part of the cup-shaped zone 146 in the epitaxial layer will be small at the area of the zone 154. At the edge of the buried part around the zone 154, however, this expansion will be considerable because here the donor concentration is considerably smaller. In this manner a part of the upright wall of the zone 146 is already formed by diffusion from the substrate. In a slightly varied manufacturing process and using this effect, the upright wall is obtained for the greater part from the substrate and completed from the upper surface during the diffusion operation in which the intermediate part of the second zone is also provided. In this manner a diffusion process is dispensed with. For the rest, this effect can even be intensified if necessary by using activators having a small diffusion coefficient, for example, boron or arsenic, in the part of the buried part covered by the zone 154 and by using activators having a large diffusion coefficient, for example, aluminum or phosphorus, at the edge of the buried part. Activators, for example, those having a large diffusion coefficient, can also be provided in an annular region around the buried zone 154 at the surface of the epitaxial layer 141.

Apertures for contacting the various semiconductor zones can be provided in normal manner in the insulating layer. The metallisation pattern for the electric connection and through-connection can then be provided in said apertures and on the insulating layer, for example, by vapour-depositing a layer of aluminum which is then etched to a pattern.

The semiconductor body can finally be assembled in normal manner in a normal envelope. The method described is only an example. Another possibility is inter alia that the doping is provided by ion implantation. In that case, even a homogeneously doped crystal without an epitaxial layer may be used because in ion implantation the buried zones can actually be provided via the free upper surface. In connection with the use of the substrate as a supply connection, however, a low-ohmic substrate is preferably used as a starting material on which a high-ohmic epitaxial layer is provided. The advantage of the use of a composite epitaxial layer as in the above-described method is that there is a larger freedom in the choice of the doping concentrations for the two adjoining buried zones of conductivity types which are opposite to each other. These buried zones can both be provided in the substrate. In that case, however, the fact that two times overdoping must be reached is to be taken into account in determining the doping concentration of the substrate and of the two buried zones, which may mean that notably the concentration in the low-ohmic substrate would have to be chosen to be higher than is desirable with a view to a low series resistance for the supply connection.

The doping of the substrate may also be chosen to be substantially independent when the layer adjoining the surface of the substrate, at least at the area of the surface region of the first buried zone, has a higher resistivity than the remaining part of the substrate. This can be obtained by means of out-diffusion which, if desirable, may occur locally or, for example, with a high-ohmic epitaxial layer in which in the latter case the substrate crystal and the epitaxial layer together constitute the actual substrate region of the structure described.

The device shown in FIGS. 10 to 16, can be manufactured by means of a simplified variation of the method already described. Up to and including the provision of the intermediate part 110 of the base zone, the manufacture is analogous, in which the processes for obtaining a low-ohmic buried part in the collector zone 106 can be omitted. Also in connection herewith a single epitaxial layer **109*b* can without objection be combined with a sufficiently low-ohmic substrate 109*a*.**

The object of the variation of the method is that, after providing the intermediate part 110, the aperture in the masking layer 123 through which the activators have been provided in the part 110 can be etched open again without masking, as a result of which the alignment of a photomask is avoided or, if a contact zone 114 is to be provided simultaneously with the emitter zone 104, becomes less critical as regards the desirable accuracy. Making use of a difference in thickness and/or composition of the masking layer inside and outside the closed aperture during the reopening of the aperture by etching without a photolacquer masking, the reopened aperture is automatically very accurately aligned on the original aperture. Actually both apertures are substantially identical. This reopening is of course omitted if, during and after the formation of said part 110, the aperture used for that purpose remains open which may be the case, for example, when the diffusion is carried out in a non-oxidizing medium.

The above applies analogously to the aperture which is necessary for the emitter metal contact. The additional advantage in this case is that the metal contact extends automatically up to a small distance from the p-n junction, as a result of which the series resistance of the emitter can be particularly low.

It will be obvious that the invention is not restricted to the examples described but that many variations are possible to those skilled in the art without departing from the scope of this invention. For example, the n-type part 20 of the epitaxial layer 3 which is associated with the common collector zone of the transistors $T_3$ and $T_4$ may consist of two parts which, for example, are separated from each other by the isolated parts 8 and 9 with the isolation zones 15 and 17, and are connected together only via the n-type substrate 2, the base and emitter zone of the transistor $T_3$ being provided in one and the base and emitter zone of the transistor $T_4$ being provided in the other of the said parts separated from each other. In this case also the buried layer 25 consists of two parts which are separated from each other in which a part is present below the base zone of the transistor $T_3$ and the other part is present below the base zone of the transistor $T_4$. The provision of these transistors $T_3$ and $T_4$ in separate parts of the epitaxial layer may be of importance for a simple wiring on the insulating layer 29. Both sub-groups may comprise more than two bipolar transistors, while other circuit elements, for example, resistors and diodes, may be present, the invention being of particular importance, however, for semiconductor devices in which the transistors to be provided in isolated parts are only bipolar transistors. Semiconductor materials other than silicon, for example, a III-V compound, may be used with impurities adapted to the said compounds in normal manner. In the embodiments described n--type conductivity may be replaced by p-type conductivity and conversely. In the embodiments described a p-np transistor can be provided in a simple manner by providing a further isolated n-type part which forms the base zone of said transistor, the isolation zones which surround the n-type part forming the p-type collector zone of the p-n-p transistor, a p-type surface zone which forms the emitter zone of the p-n-p transistor being provided in the further isolated part. The buried layers 21 and 22 need not adjoin the isolation surface zone 17 and may be situated at some distance therefrom.

The self-isolating transistor according to the invention as described, in which at least three successive semiconductor zones extend in the substrate region from a surface of a substrate region, in which one of the said semiconductor zones forms a p-n junction with the substrate region which junction serves as an isolating junction, in which the last-mentioned isolating semiconductor zone comprises a buried part which, in a direction transverse to the surface, serves as a separation between the two other semiconductor zones of the transistor and the substrate region, and an upright wall-shaped part cohering with the buried part and extending up to the surface and also serving as a separation between the two other semiconductor zones and the substrate region, in which the isolating semiconductor zone surrounds the two other semiconductor zones and the wall-shaped part comprises at the surface at least an extension formed at the surface by overdoping a part of the substrate region and situated above the buried part, which extension forms the intermediate one of the three semiconductor zones of the transistor, can be used, besides in the combinations described with reference to the figures, also in combination with, for example, one or more further self-isolating transistors with field effect transistor(s), with diodes and/or with capacitors. The second transistor may be lacking. In the case of combination with one or more further isolated circuit elements, the cup-shaped isolation zones to be used for said elements cannot only, as described, form part themselves of the relative circuit elements and form, for example, the collector of a complementary transistor, but they may also serve only for the isolation. In addition the third zone of the second transistor may also be an epitaxial layer which is provided on a substrate crystal of the opposite conductivity type or on an insulating base or support. The upright wall of the cup-shaped isolation zone can be obtained not only partly but also entirely by diffusion from a buried region provided at the boundary of the substrate and the epitaxial layer. The invention may also be used upon integration of logic circuits in other constructions, for example, DTL, ECL and $E^2CL$. High value resistors, for example, the resistor $R_{11}$ in FIG. 15, can be constructed for a more or less large part as a buried or pinch resistor so as to save space by covering them locally with a zone of the opposite conductivity type. For the insulating and/or masking layers other materials, for example, silicon nitride, aluminum oxide or combinations thereof with silicon oxide may be used. In addition to aluminum other conductors, such as molybdenum, or composite layers which have been built up from various layers, such as titanium-platinum-gold, are to be considered for the metallisation pattern. The diffused contact zones may be replaced, for example, by platinum-silicide contacts. In the cup-shaped isolating part of the self-isolating transistor, and/or in that of a further circuit element one or more diodes can simply be realized by providing therein simultaneously with the emitter zone, one or more additional zones which form, for example, cathodes, the isolating part serving as the anode in that case. The dimensions of the isolating part usually are sufficiently large to substantially entirely avoid parasitic transistor action between said additional zones, the isolating part and an adjoining semiconductor region, such as the collector zone or the substrate.

It is to be noted that in the examples described the cup-shaped isolation zone fully surrounds the remaining zones of the self-isolating transistor which is the case also preferably. It will be obvious however, that in circumstances the cup-shaped isolation zone may be locally interrupted, for example, to obtain a connection on the collector zone internally in the semiconductor body.

What is claimed is:

1. A semiconductor integrated circuit device comprising a semiconductor body portion of a first type conductivity and containing at least a first and a second transistor isolated by a P-N junction, the semiconductor body portion having a substantially plane surface, the first transistor comprising a group of three successive semiconductor zones alternating in conductivity type and adjoining said surface, the second zone having a part extending to below the first zone and the third zone extending to below the second zone, the second zone of the first transistor being of a second type conductivity and comprising besides the part present intermediate the first and the third zones a cup-shaped part which coheres with said intermediate part and which entirely surrounds the said third zone in the semiconductor body except for the part adjoining the surface, the second zone cup-shaped part forming with the first type body portion a generally cup-shaped isolating P-N junction which entirely surrounds the first transistor except for the part thereof adjoining the surface, the second transistor comprising three vertically arranged successive semiconductor zones alternating in conductivity type with its second zone also being of the second type conductivity and with its third zone being constituted by a part of the body portion of the first type conductivity, said second transistor being of the same type as the first transistor but being isolated therefrom by the isolating P-N junction, the first zone of the first transistor and the first zone of the second transistor having the same depth, the second zone intermediate part of the first transistor and the second zone of the second transistor having the same depth, said zones of the same depth having been formed simultaneously.

2. A semiconductor device as claimed in claim 1 wherein the first zone of the second transistor is surrounded entirely in the semiconductor body by the second zone of said second transistor, the second transistor being a bipolar transistor the first, the second and the third zone of which form the emitter zone, the base zone and the collector zone respectively.

3. A semiconductor device as claimed in claim 2 wherein the second zone of the first transistor entirely surrounds the first zone of the first transistor in the semiconductor body, the first, the second and the third zone of the first transistor forming the emitter zone, the base zone and the collector zone, respectively, of a bipolar transistor.

4. A semiconductor device as claimed in claim 1 wherein the third zone of the second transistor is a substrate portion of first type conductivity on which an epitaxial layer of first type conductivity is provided, the cup-shaped part of the second zone of the first transistor comprising a surface zone which at the surface of the semiconductor body surrounds a part of the epitaxial layer, said surface zone extending in the semiconductor body up to and cohering with a buried region of the second type conductivity which is present at the boundary of the epitaxial layer and the substrate.

5. A semiconductor device as claimed in claim 1 wherein in addition to the first and the second transistor at least a third circuit element is present which is also substantially surrounded by an isolating P-N junction between a cup-shaped second type zone and the third zone of the second transistor.

6. A semiconductor device as claimed in claim 5 wherein the cup-shaped part of the second zone of the first transistor coheres with the cup-shaped zone of the third circuit element as a result of which the first transistor and the third circuit element are electrically interconnected.

7. A semiconductor integrated circuit device comprising a semiconductor body and containing several circuit elements including at least a first transistor isolated by a P-N junction, said semiconductor body having a semiconductor substrate common body portion of a first type conductivity and a surface layer of said first type conductivity which has a lower dopant concentration than said substrate common body portion, said surface layer having a substantially plane surface, the first transistor comprising at least a group of three successive semiconductor zones alternating in conductivity type with said zones being vertically arranged in said surface layer and adjoining said surface, the second zone having a higher dopant concentration than an adjoining portion of the third zone and having a part extending to below the first zone and the third zone being constituted by part of the surface layer and extending to below the second zone, the second zone of the first transistor being of a second type conductivity and comprising besides the part present intermediate the first and the third zones a cup-shaped part which coheres with said intermediate part and which entirely surrounds the said third zone in the semiconductor body except for the part adjoining the surface, the second zone cup-shaped part including a buried layer at the substrate-surface layer interface and of higher dopant concentration than the substrate and the surface layer and forming with the first type body portion a generally cup-shaped isolating P-N junction which entirely surrounds the first transistor except for the part thereof adjoining the surface.

8. A semiconductor device as claimed in claim 7 wherein the first zone of the first transistor is surrounded entirely by the second zone in the semiconductor body.

9. A semiconductor device as claimed in claim 8 wherein the contour of the first zone of the first transistor at the surface is spaced from the contour of the intermediate part of the second zone substantially everywhere at the same distance.

10. A semiconductor device as claimed in claim 7 wherein the intermediate part, in so far as it is present within the cup-shaped part, for the greater part adjoins and is surrounded by the third zone of the first transistor at the surface.

11. A semiconductor integrated circuit device comprising a semiconductor body portion of a first type conductivity and containing at least a first and a second transistor isolated by a P-N junction, the semiconductor body portion having a substantially plane surface, the first transistor comprising a group of three successive semiconductor zones alternating in conductivity type and adjoining said surface, the second zone having a part extending to below the first zone and the third zone extending to below the second zone, the second zone of the first transistor being of a second type conductivity and comprising besides the part present intermediate the first and the third zones a cup-shaped part which coheres with said intermediate part and which entirely surrounds the said third zone in the semiconductor body except for the part adjoining the surface, the second zone cup-shaped part forming with the first type body portion a generally cup-shaped isolating P-N junction which entirely surrounds the first transistor except for the part thereof adjoining the surface, the second transistor comprising three vertically arranged successive semiconductor zones alternating in conductivity type with its second zone also being of the second type conductivity and with its third zone being constituted by a part of the body portion of the first type conductivity, said second transistor being of the same type as the first transistor but being isolated therefrom by the isolating P-N junction, the second zone of the first transistor at the surface comprising a part projecting locally outside the cup-shaped part, the projecting part adjoining the third zone of the second transistor, extending in a direction transverse to the surface less deep in the semiconductor body than the cup-shaped part, and comprising a conductive contact.

* * * * *